(12) United States Patent  (10) Patent No.: US 7,701,758 B2
Nakai                     (45) Date of Patent:    Apr. 20, 2010

(54) NONVOLATILE MEMORY DEVICE AND CONTROL METHOD THEREOF

(75) Inventor: Kiyoshi Nakai, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 277 days.

(21) Appl. No.: 11/771,537

(22) Filed: Jun. 29, 2007

(65) Prior Publication Data

US 2008/0123395 A1    May 29, 2008

(30) Foreign Application Priority Data

Jul. 7, 2006    (JP) .............................. 2006-187693

(51) Int. Cl.
*G11C 11/00*    (2006.01)
(52) U.S. Cl. ...................... 365/163; 365/148
(58) Field of Classification Search ................. 365/163, 365/148, 100
See application file for complete search history.

(56) References Cited

U.S. PATENT DOCUMENTS

| 4,181,913 | A  | * | 1/1980  | Thornburg ..................... 257/5 |
| 5,536,947 | A  |   | 7/1996  | Klersy et al. |
| 7,038,961 | B2 | * | 5/2006  | Sakata et al. ................. 365/205 |
| 7,106,618 | B2 |   | 9/2006  | Morimoto |
| 7,123,535 | B2 | * | 10/2006 | Kurotsuchi et al. ...... 365/225.7 |
| 7,301,887 | B2 | * | 11/2007 | Rust et al. ................... 369/126 |

FOREIGN PATENT DOCUMENTS

| JP | 11-066872     |    | 8/1997  |
| JP | 2005-166210   |    | 6/2005  |
| WO | 2004-114315   | A1 | 12/2004 |

* cited by examiner

*Primary Examiner*—Anh Phung
(74) *Attorney, Agent, or Firm*—Sughrue Mion, PLLC

(57) ABSTRACT

To provide a nonvolatile memory including a word-line drive circuit that supplies a selective voltage to a selective transistor connected in series to a nonvolatile memory device. The word-line drive circuit applies a first selective voltage VDD to a control electrode of the selective transistor in a first period, and applies a second selective voltage VPP higher than the first selective voltage VDD to the control electrode of the selective transistor in a second period that follows the first period. Thereby, a current drive capability of the selective transistor is gradually changed. Thus, it becomes possible to limit the current drive capability of the selective transistor at timing at which snap-back is caused. As a result, an excessive current caused by the snap-back is suppressed, thereby reducing damage inflicted on the nonvolatile memory device.

19 Claims, 11 Drawing Sheets

NONVOLATILE MEMORY DEVICE AND CONTROL METHOD THEREOF

TECHNICAL FIELD

The present invention relates to an electrically-rewritable nonvolatile memory device and a control method thereof. More specifically, the present invention relates to a nonvolatile memory device using a nonvolatile memory element having a negative resistance characteristic and a control method thereof.

BACKGROUND OF THE INVENTION

In personal computers or servers, hierarchically constructed various storage devices are used. A lower-hierarchical storage device is required to be low price and has a large capacity, while a higher-hierarchical one is required to be capable of high-speed access. As a lowest-hierarchical storage device, a magnetic storage such as a hard disk drive and a magnetic tape is generally used. The magnetic storage is nonvolatile and capable of saving a considerably large amount of data at a lower price as compared to a semiconductor memory device or the like. However, the magnetic storage is slow in access speed, and does not have random accessibility in many cases. Therefore, a program or data to be saved for a long period is stored in the magnetic storage, and is optionally changed to a higher-hierarchical storage device.

A main memory is a storage device higher in hierarchy than the magnetic storage. Generally, a DRAM (Dynamic Random Access Memory) is used for the main memory. The DRAM can be accessed at higher speed as compared to the magnetic storage, and in addition, the DRAM has the random accessibility. Further, the DRAM has a characteristic that a cost-per-bit is lower in price than a high-speed semiconductor memory such as an SRAM (Static Random Access Memory).

A highest-hierarchical storage device is an internal cache memory included in an MPU (Micro Processing Unit). The internal cache memory is connected via an internal bus to a core of the MPU, and thus, it can be accessed at remarkably high speed. However, a recording capacity to be secured is considerably small. As a storage device that configures a hierarchy between the internal cache and the main memory, a secondary cache, or a tertiary cache, or the like is used occasionally.

The reason that the DRAM is selected as the main memory is that it has a very good balance between the access speed and the cost-per-bit. Further, the DRAM has a large capacity among the semiconductor memories, and recently, a chip with a capacity of 1 gigabit or more has been developed. However, the DRAM is a volatile memory, and stored data is lost when the power is turned off. Thus, the DRAM is not suitable for a program or data to be save for a long period. In the DRAM, a refresh operation needs to be periodically performed to save the data even while the power supply is turned on. Thus, there is a limit to reduction in power consumption, and there is a problem that complicated control by a controller is needed.

As a nonvolatile semiconductor memory of large capacity, a flash memory is known. However, the flash memory has disadvantages in that a large amount of electricity is needed to write and delete the data, and a writing time and a deleting time are very long. Accordingly, it is not appropriate to replace the DRAM as the main memory. Other nonvolatile memories that have been proposed include an MRAM (Magnetoresistive Random Access Memory), an FRAM (Ferroelectric Random Access memory) or the like. However, it is difficult to obtain a storage capacity equal to that of the DRAM.

On the other hand, as a semiconductor memory that replaces the DRAM, a PRAM (Phase change Random Access Memory) in which a phase change material is used to record is proposed (see U.S. Pat. No. 5,536,947). In the PRAM, the data is stored by a phase state of the phase change material included in a recording layer. That is, the phase change material differs greatly in electrical resistance between a crystalline phase and an amorphous phase. The data can be stored by using this characteristic.

The phase state can be changed by applying a write current to the phase change material, which heats the phase change material. Data-reading is performed by applying a read current to the phase change material and sensing the resistance value. The read current is set to a value sufficiently small as compared to the write current so that no phase change occurs. Thus, the phase state of the phase change material does not change unless a high heat is applied thereto, and accordingly, even when the power is turned off, the data is not lost.

FIG. 9 is a graph showing a current-voltage characteristic of a nonvolatile memory element in which a phase change material is used.

As shown in FIG. 9, a nonvolatile memory element in a crystalline state (defined as "set state" herein) shows a nearly linear current-voltage characteristic A, and can be considered as a general resistance device. Contrary thereto, a nonvolatile memory element in an amorphous state (defined as "reset state" herein) has a so-called negative resistance characteristic B, and is in an almost insulated state unless voltage exceeding a predetermined threshold value Vt is applied. When the voltage exceeds the threshold value Vt, snap-back is caused, and it consequently results in a low resistance.

To change the nonvolatile memory element having such a characteristic from the set state to the reset state, a current in a reset region shown in FIG. 9 can be applied to the nonvolatile memory element. The current in the reset region is a current necessary for heating the phase change material that configures the nonvolatile memory element to a temperature above the melting point. When such a current is applied, and thereafter, the current is cut off to rapidly cool the phase change material. As a result, the phase change material is changed to the amorphous state.

To change the nonvolatile memory element from the reset state to the set state, a current in a set region shown in FIG. 9 can be applied to the nonvolatile memory element. The current in the set region is a current necessary for heating the phase change material that configures the nonvolatile memory element to temperatures above a crystallization temperature and below the melting point. When such a current is applied for a predetermined period, and thereafter, the current is cut off to cool the phase change material. As a result, the phase change material is crystallized.

However, as described above, the nonvolatile memory element in the reset state has the negative resistance characteristic B. Thus, to change from the reset state to the set state, firstly, it is necessary to apply voltage that exceeds the threshold value Vt to the nonvolatile memory element. This leads to the accumulation of electric charges Q defined by $C_{BL} \times Vt$ into a bit line in the initial stage of a write operation, where $C_{BL}$ is a capacity of bit line. The accumulated electric charges Q are discharged by the snap-back via the nonvolatile memory element. Accordingly, when the capacity of bit line $C_{BL}$ becomes large, an amount of current to be discharged by the snap-back via the nonvolatile memory element increases.

FIG. 10 is a graph showing a current waveform at the time of changing a nonvolatile memory element from the reset state to the set state.

As shown in FIG. 10, to change the nonvolatile memory element from the reset state to the set state, a current that equals to the set region shown in FIG. 10 can be applied to the nonvolatile memory element. However, as described above, the nonvolatile memory element in the reset state has a negative resistance characteristic. Thus, when the electric charges Q are discharged by the snap-back, an excessive current is passed. While the amount of excessive current depends on the capacity of bit line $C_{BL}$, in most cases, the excessive current is larger than the current in the reset region, and as a result, the phase change material is momentarily exposed to a high heat.

Accordingly, the excessive current by the snap-back can damage the phase change material. Thus, this can be a cause of decreasing the number of rewritings (rewritable life).

SUMMARY OF THE INVENTION

The present invention has been achieved to solve such problems, and an object the present invention is to provide a nonvolatile memory device in which occurrence of an excessive current caused by snap-back is suppressed and a control method thereof.

A nonvolatile memory device according to the present invention comprises:

a nonvolatile memory element having a negative resistance characteristic;

a selective transistor connected in series to the nonvolatile memory element;

a bit line that supplies the nonvolatile memory element with a current; and a controller that changes a current drive capability of the selective transistor gradually or continuously during a write operation to the nonvolatile memory element.

According to the present invention, there is provided a unit that changes a current drive capability of a selective transistor gradually or continuously at the time of writing permits limiting of the current drive capability of the selective transistor at timing at which snap-back is caused. Therefore, an excessive current generated by the snap-back is suppressed, and thus, it becomes possible to reduce damage inflicted on the nonvolatile memory element.

A control method of a nonvolatile memory device according to the present invention including a nonvolatile memory element having a negative resistance characteristic, a selective transistor connected in series to the nonvolatile memory element, and a bit line that supplies the nonvolatile memory element with a current, the control method comprises:

applying a first selective voltage to a control electrode of the selective transistor in a first period; and applying a second selective voltage higher than the first selective voltage to the control electrode of the selective transistor in a second period that follows the first period.

According to the present invention, the current drive capability of the selective transistor is limited in the first period. Thus, when the snap-back is caused to happen in this period, it becomes possible to suppress the excessive current.

There is no limitation on types of the nonvolatile memory device as long as the nonvolatile memory device is a device having a negative resistance characteristic. Typical devices include a nonvolatile memory element in which a phase change material such as a chalcogenide material is used.

As described above, according to the present invention, an excessive current caused by snap-back can be suppressed. Therefore, damage inflicted on the nonvolatile memory element can be reduced, thereby preventing decrease of the number of rewritings (rewritable life) of a nonvolatile memory.

BRIEF DESCRIPTION OF THE DRAWINGS

The above and other objects, features and advantages of this invention will become more apparent by reference to the following detailed description of the invention taken in conjunction with the accompanying drawings, wherein.

DETAILED DESCRIPTION OF THE EMBODIMENTS

Preferred embodiments of the present invention will now be explained in detail with reference to the drawings.

Figure 1:
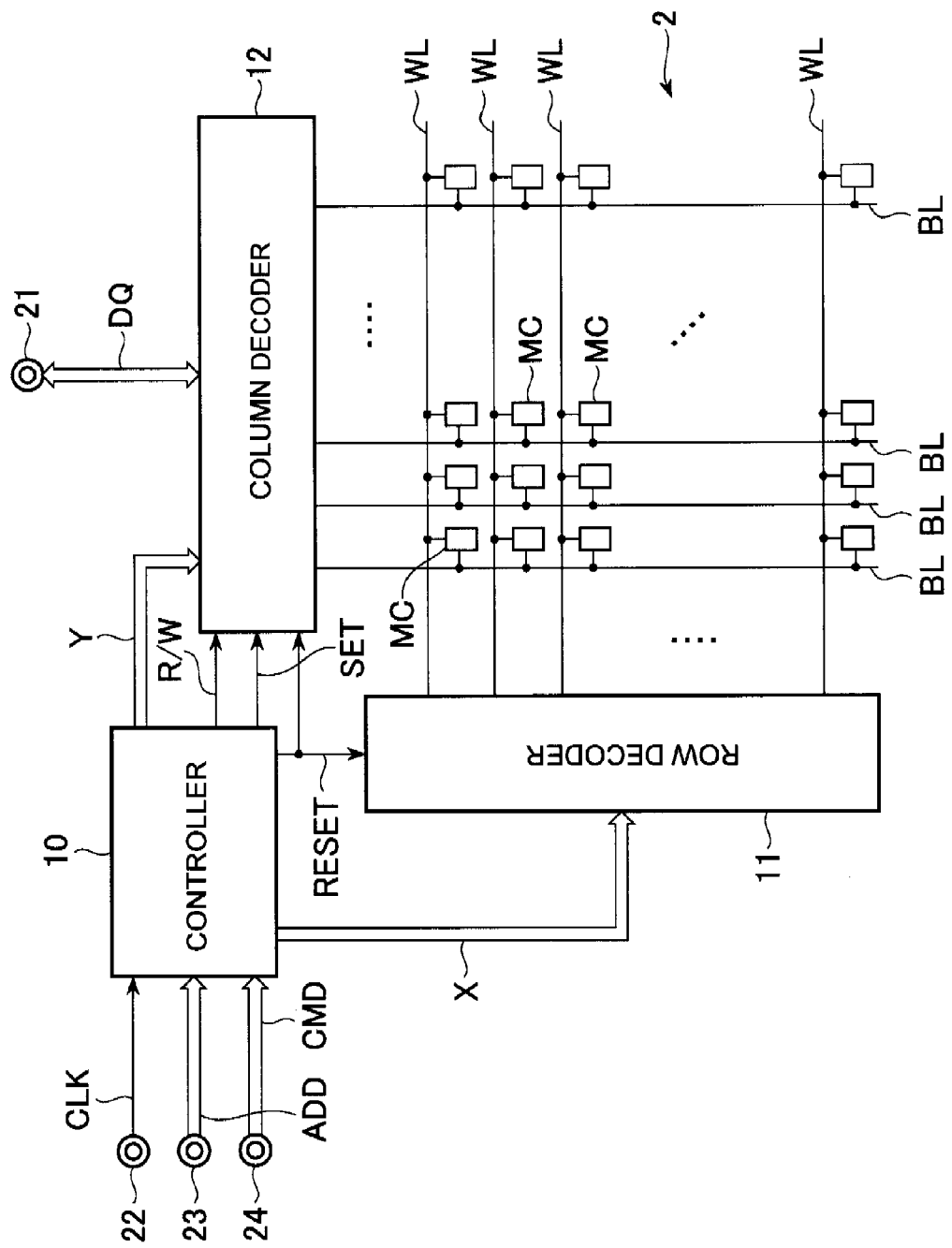
FIG. 1 is a block diagram schematically showing a configuration of principal parts of a nonvolatile memory device according to a preferred embodiment of the present invention.

FIG. 1 is a block diagram schematically showing a configuration of principal parts of a nonvolatile memory device according to a preferred embodiment of the present invention.

As shown in FIG. 1, a memory cell array 2 of a nonvolatile memory according to the present embodiment has a configuration including a plurality of word lines WL and a plurality of bit lines BL that crisscross each other, and having a memory cell MC arranged at each intersection.

Figure 2:
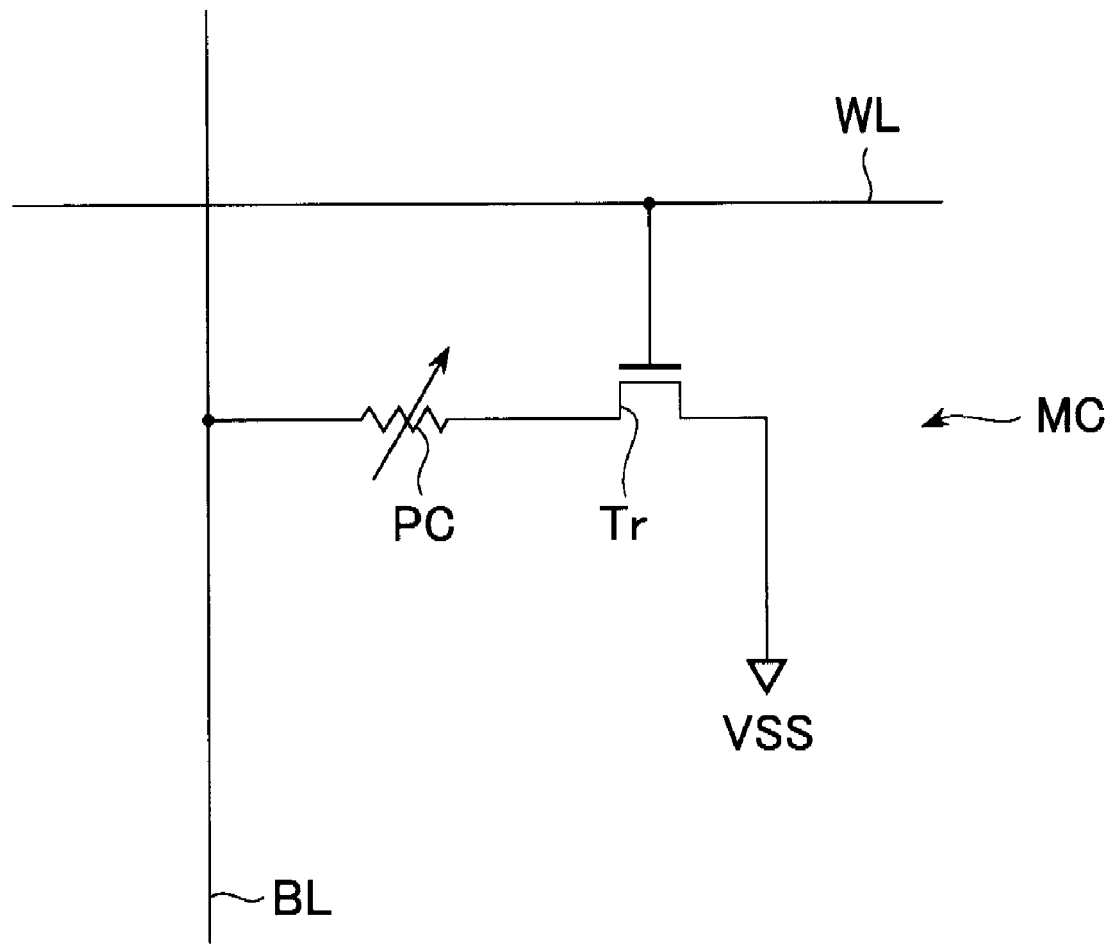
FIG. 2 is a circuit diagram of the memory cell.

FIG. 2 is a circuit diagram of the memory cell MC.

As shown in FIG. 2, the memory cell MC is configured of a nonvolatile memory element PC formed of a phase change material, and a selective transistor Tr. The nonvolatile memory element PC and the selective transistor Tr are connected in series between the bit line BL and a source electric potential VSS.

There is no limitation on the phase change material that configures the nonvolatile memory element PC as long as it takes two or more phase states and differs in electrical resistance depending on the phase state. However, it is preferable to select a so-called chalcogenide material. The chalcogenide material means an alloy containing at least one of the elements of germanium (Ge), antimony (Sb), tellurium (Te), indium (In), selenium (Se), or the like. Examples include binary system alloys such as GaSb, InSb, InSe, $Sb_2Te_3$, and GeTe; ternary system alloys such as $Ge_2Sb_2Te_5$, InSbTe, GaSeTe, $SnSb_2Te_4$, and InSbGe; and quaternary system alloys such as AgInSbTe, (GeSn)SbTe, GeSb(SeTe), and $Te_{81}Ge_{15}Sb_2S_2$.

The phase change material that includes the chalcogenide material can take either of the following phase state, that is, an amorphous phase or a crystalline phase. In the amorphous phase, the phase change material is relatively in a high-resistance state, and in the crystalline phase, it is relatively in a low-resistance state.

The selective transistor Tr is configured of an N-channel MOS transistor, and its gate electrode is connected to a corresponding word line WL. Thereby, the activation of the word line WL leads to a state in which the nonvolatile memory element PC is connected between the bit line BL and the source electric potential VSS.

Returning back to FIG. 1, the word lines WL are driven by a row decoder 11 under the control of a controller 10. The row decoder 11 is supplied a row address X by the controller 10, and activates any one of the plurality of word lines WL based on the row address X. However, when the memory cell array 2 is divided into a plurality of sub arrays, the plurality of word lines WL that do not share the bit lines can be simultaneously activated.

On the other hand, the bit lines BL are driven by a column decoder 12 under the control of the controller 10, and at the time of either read or write operation, supply each bit line BL with the appropriate current. The column decoder 12 is supplied a column address Y and a read/write signal R/W by the controller 10. When the read/write signal R/W indicates the read operation, the column decoder 12 outputs data DQ indicated by the column address Y, out of the data read from each bit line BL, to a data input/output terminal 21. On the other hand, when the read/write signal R/W indicates the write operation, the column decoder 12 drives each bit line BL based on the data DQ supplied from the data input/output terminal 21 and the column address Y. A method of driving the bit lines BL at the time of the write operation is described in detail later.

The controller 10 is supplied a clock signal CLK, an address signal ADD, and a command signal CMD, via a clock terminal 22, an address terminal 23, and a command terminal 24, respectively. The controller 10 controls the row decoder 11 and the column decoder 12 based on the clock signal CLK, the address signal ADD, and the command signal CMD.

The controller 10 generates a set signal SET and a reset signal RESET. The set signal SET and the reset signal RESET are timing signals when the read/write signal R/W indicates the write operation. The set signal SET is supplied to the column decoder 12. The reset signal RESET is supplied to both the row decoder 11 and the column decoder 12.

Figure 3:
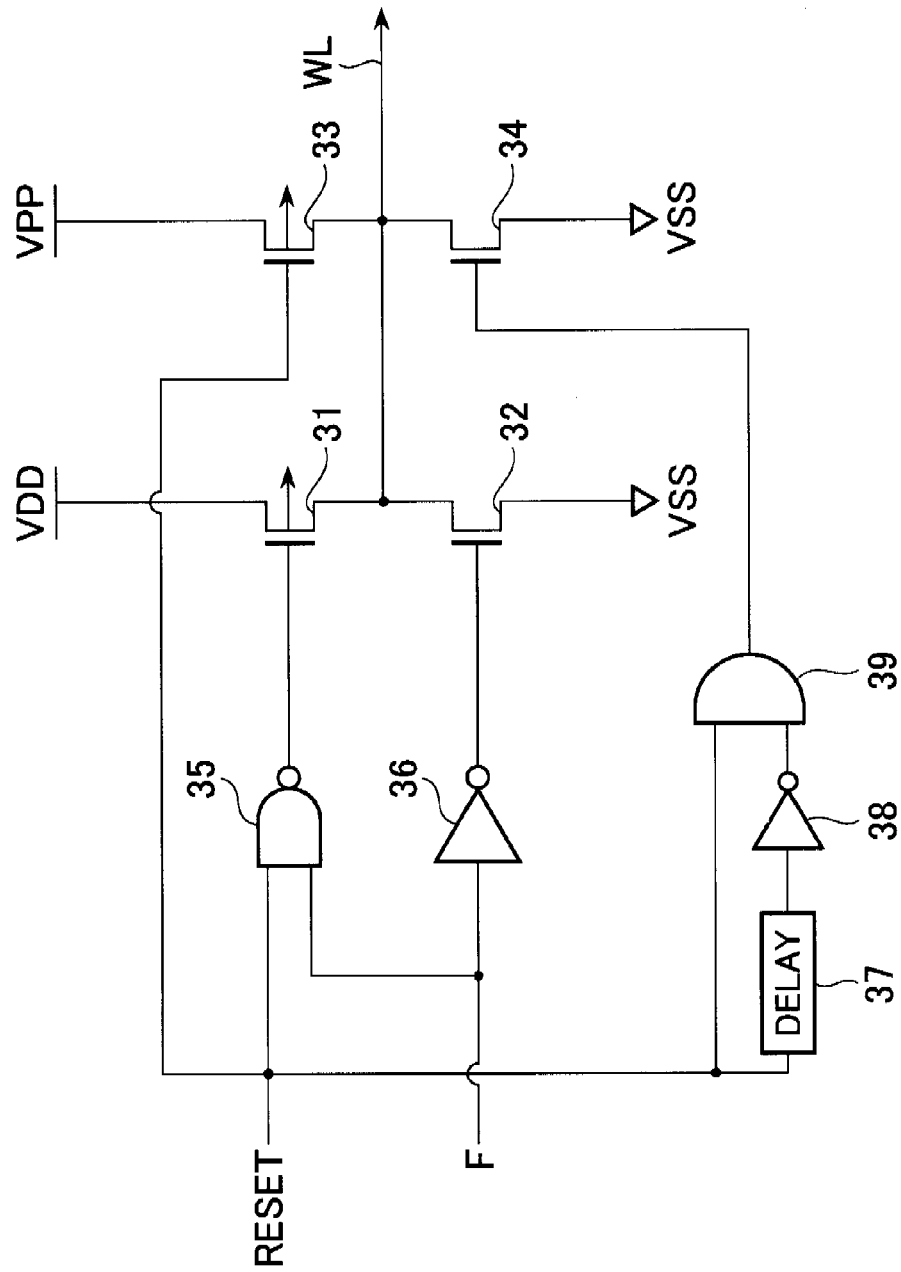
FIG. 3 is a circuit diagram of a word-line drive circuit included in the row decoder shown in FIG. 1.

FIG. 3 is a circuit diagram of a word-line drive circuit 30 included in the row decoder 11.

The word-line drive circuit 30 shown in FIG. 3 is a circuit corresponding to one word line WL, and accordingly, within the row decoder 11, the word-line drive circuit 30 corresponding to each word line WL is arranged.

As shown in FIG. 3, the word-line drive circuit 30 includes: a P-channel MOS transistor 31 and an N-channel MOS transistor 32 connected in series between the first power electric potential VDD and the source electric potential VSS; and a P-channel MOS transistor 33 and an N-channel MOS transistor 34 connected in series between a second power electric potential VPP (>VDD) and the source electric potential VSS. Drains of the transistors 31 to 34 are commonly connected, and connected to the corresponding word line WL.

The word-line drive circuit 30 further includes an NAND gate 35 that receives a select signal F and the reset signal RESET, and an inverter 36 that receives the select signal F. These outputs are supplied to a gate electrode of each of the transistors 31 and 32. The reset signal RESET also is directly supplied to a gate electrode of the transistor 33. The select signal F is a signal generated based on the row address X, and the select signal F corresponding to the word line WL to be activated becomes a high level.

The word-line drive circuit 30 further includes a delay circuit 37 that receives the reset signal RESET, an inverter 38 that receives output of the delay circuit 37, and an AND gate 39 that receives output of the inverter 38 and the reset signal RESET. Output of the AND gate 39 is supplied to a gate electrode of the transistor 34.

With such a circuit configuration, the output of the word-line drive circuit 30 results in any one of the levels of the first power electric potential VDD, the second power electric potential VPP, and the source electric potential VSS. That is, each word line WL results in being driven at a level of any one of the three values.

Figure 4:
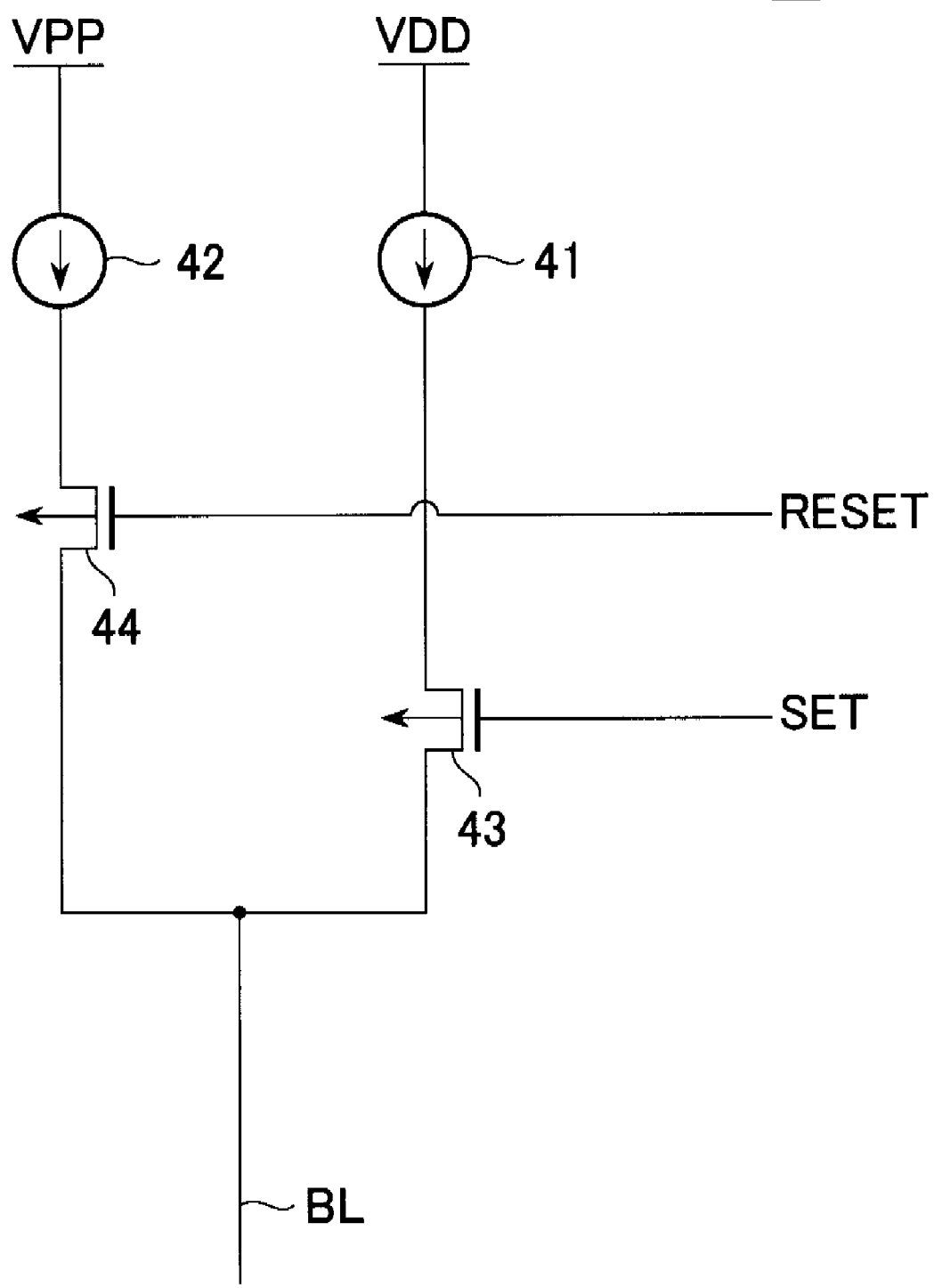
FIG. 4 is a circuit diagram of a bit-line drive circuit included in the column decoder shown in FIG. 1.

FIG. 4 is a circuit diagram of a bit-line drive circuit 40 included in the column decoder 12.

The bit-line drive circuit 40 is activated when the read/write signal R/W indicates the write operation, and corresponds to one bit line BL as shown in FIG. 4. Within the column decoder 12, a plurality of bit-line drive circuits 40 are arranged. However, it is not necessary to assign the bit-line drive circuits 40 to all the bit lines BL. It may be sufficient to assign one bit-line drive circuit 40 to a plurality of bit lines BL alternatively selected by a column switch.

As shown in FIG. 4, the bit-line drive circuit 40 includes a set-use constant current circuit 41 connected to the first power electric potential VDD, and a reset-use constant current circuit 42 connected to the second power electric potential VPP. The set-use constant current circuit 41 is a current source that supplies a current in a set region, and the reset-use constant current circuit 42 is a current source that supplies a current in a reset region. The bit-line drive circuit 40 further includes a P-channel MOS transistor 43 of which source is connected to the set-use constant current circuit 41, and a P-channel MOS transistor 44 of which source is connected to the reset-use constant current circuit 42. Drains of the transistors 43 and 44 are commonly connected, and connected to the corresponding word line BL.

A gate electrode of the transistor 43 is supplied the set signal SET. Thereby, the set-use constant current circuit 41 and the transistor 43 configure a drive circuit for setting the nonvolatile memory element PC. On the other hand, a gate electrode of the transistor 44 is supplied the reset signal RESET. Thereby, the reset-use constant current circuit 42 and the transistor 44 configure a drive circuit for resetting the nonvolatile memory element PC.

Which of the transistors 43 or 44 are conducted is selected by data to be written, that is, a logic level of the data DQ. Specifically, the bit-line drive circuit 40 connected to the bit line BL corresponding to the nonvolatile memory element PC to be set is supplied the set signal SET, and thereby, the transistor 43 is turned on. On the other hand, the bit-line drive circuit 40 connected to the bit line BL corresponding to the nonvolatile memory element PC that should be reset is supplied the reset signal RESET, and thereby, the transistor 44 is turned on.

Figure 5:
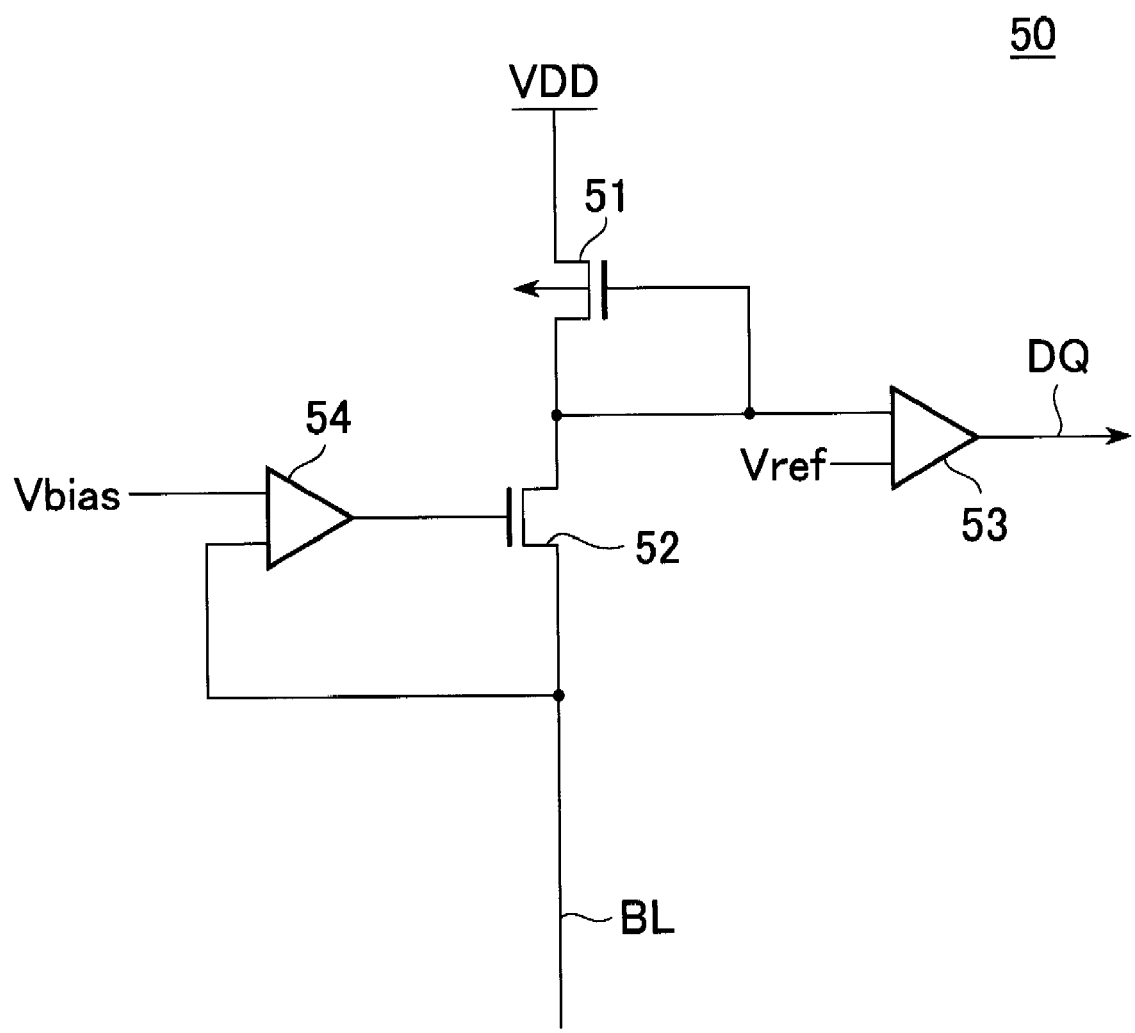
FIG. 5 is a circuit diagram of a read circuit included in the column decoder in FIG. 1.

FIG. 5 is a circuit diagram of a read circuit 50 included in the column decoder 12.

The read circuit 50 is activated when the read/write signal R/W indicates the read operation, and corresponds to one bit line BL as shown in FIG. 5. However, similarly to the bit-line drive circuit 40, it is not necessary to assign the read circuits 50 to all the bit lines BL. It may be sufficient to assign one read circuit 50 to a plurality of bit lines BL alternatively selected by the column switch.

As shown in FIG. 5, the read circuit 50 includes a P-channel MOS transistor 51 and an N-channel MOS transistor 52 connected in series between the first power electric potential VDD and the corresponding bit line BL. The transistor 51 is diode-connected, and its drain and gate are supplied to one of the input terminals of an amplifier 53. The other input terminal of the amplifier 53 is supplied a reference electric potential Vref. Output of the amplifier 53 is supplied, as the data DQ, to the data input/output terminal 21.

The read circuit 50 further includes an amplifier 54, and its output is supplied to a gate electrode of the transistor 53. One of the input terminals of the amplifier 54 is supplied a bias electric potential Vbias, and the other input terminal is connected to a drain of the transistor 52. Thereby, at the time of the read operation, a level of the bit line BL is adjusted to be in the vicinity of the bias electric potential Vbias, and the output of the amplifier 53, that is, the logic level of the data DQ, is determined according to an amount of current to be passed in the bit line BL.

The nonvolatile memory device according to the present embodiment is configured as described above. The write operation of the nonvolatile memory device of the present embodiment is described next.

Figure 6:
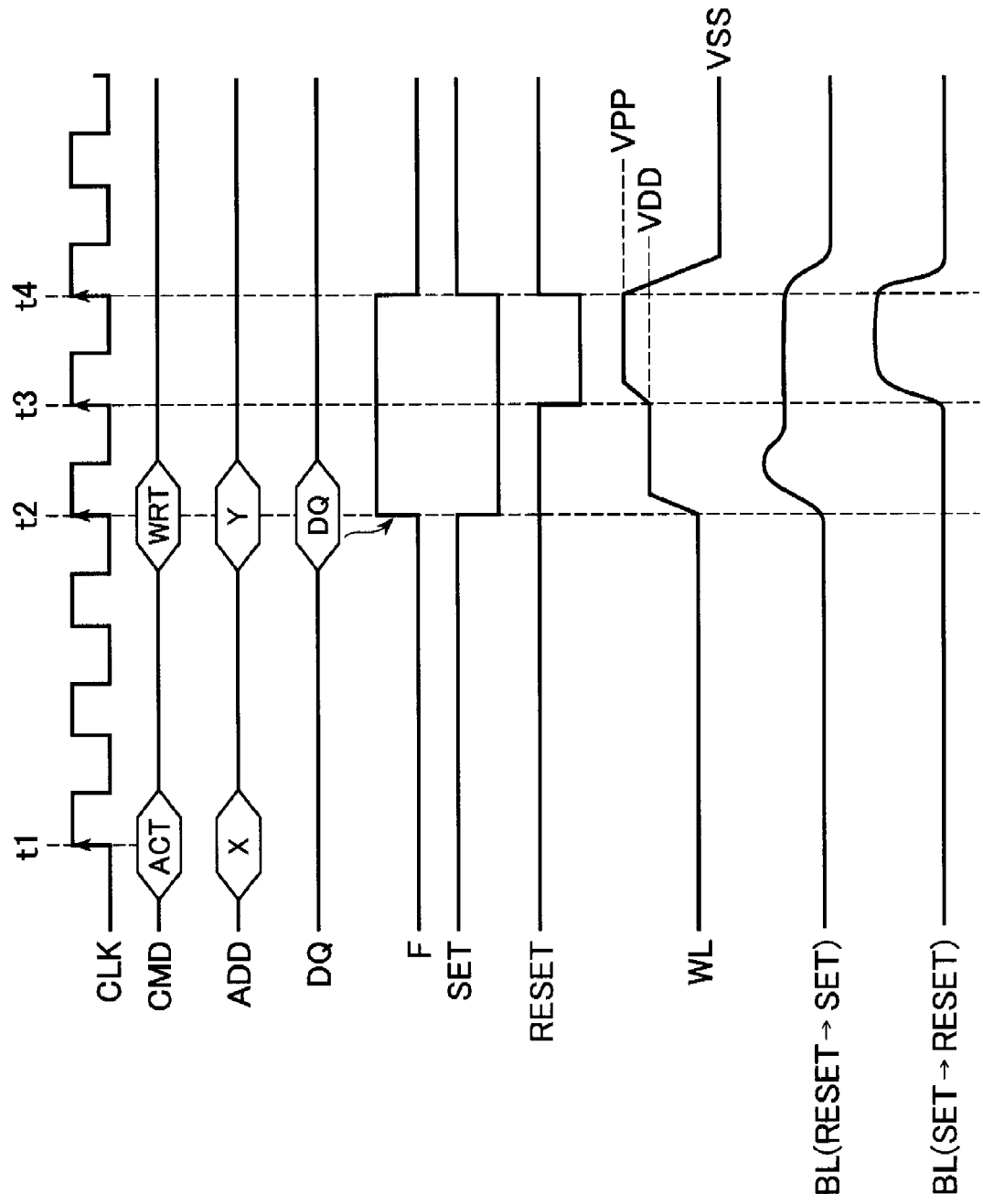
FIG. 6 is a timing chart showing the write operation of the nonvolatile memory device according to the preferred embodiment of the present invention.

FIG. 6 is a timing chart showing the write operation of the nonvolatile memory device according to this embodiment of the present invention.

As shown in FIG. 6, in the write operation of data, an activation command ACT and the row address X are supplied at time t1 synchronized with the clock signal CLK. Subsequently, a write command WRT, the column address Y, and the write data DQ are supplied at time t2. In response thereto, a predetermined select signal F based on the row address X is changed to a high level. The set signal SET and the reset signal RESET are activated to a low level in this order. However, any period before the time t2, all the select signals F are fixed to the low level. Both the set signal SET and the reset signal RESET are fixed to the high level.

Thus, in the word-line drive circuit 30 shown in FIG. 3, the transistor 32 is turned on, and the other transistors are tuned off, and accordingly, all the word lines WL are fixed to the source electric potential VSS. Accordingly, all of the selective transistors Tr included in each memory cell MC are turned off.

Thereafter, a predetermined select signal F is changed to the high level at the time t2, and when the set signal SET is changed to the low level, the transistor 31 included in the word-line drive circuit 30 is turned on and the other transistors are tuned off. The selected word line WL is supplied the first power electric potential VDD as selective voltage. Thereby, all the selective transistors Tr connected to the word line WL are brought into an on state.

The set signal SET is also supplied to the bit-line drive circuit 40 corresponding to the nonvolatile memory element PC to be set, and the transistor 43 included in the bit-line drive circuit 40 is in an on state. Thereby, the bit line BL corresponding to the nonvolatile memory element PC to be set is supplied the VDD as the write voltage, and thus, the current in the set region is supplied. A waveform of a current that passes in the bit line BL at this time is shown in BL (RESET to SET) in FIG. 6. As a result, when the nonvolatile memory element PC to be set is in the reset state, the nonvolatile memory element PC is applied voltage exceeding the threshold value Vt, and thus, snap-back is caused.

However, at this time, the gate voltage is VDD, and a current drive capability is relatively restrained to a low level. Thus, an excessive current caused due to the snap-back is limited by the present current drive capability of the selective transistor Tr.

Further, at this time, the reset signal RESET remains the high level. Accordingly, the bit line BL corresponding to the nonvolatile memory element PC to be reset is an inactivated state.

Thereafter, when the reset signal RESET is changed to the low level at time t3, the transistor 33 included in the word-line drive circuit 30 is turned on and the other transistors are tuned off. Thus, the selective voltage of the selected word line WL is changed to the second power electric potential VPP. Thereby, the current drive capability of the selective transistor Tr connected to the word line WL increases.

The reset signal RESET also is supplied to the bit-line drive circuit 40 corresponding to the nonvolatile memory element PC to be reset, and the transistor 44 included in the bit-line drive circuit 40 is in an on state. Thereby, the bit line BL corresponding to the nonvolatile memory element PC to be reset is supplied the VPP as the write voltage, and thus, the current in the reset region is supplied. At this time, a waveform of a current that passes in the bit line BL is shown in BL (SET to RESET) in FIG. 6. The current in the reset region is necessary for heating the phase change material that configures the nonvolatile memory element PC to a temperature above the fusing point, and is a relatively large amount of current. However, at this time, a gate voltage of the selective transistor Tr is increased to the VPP, and thus, it is possible to supply the nonvolatile memory element PC with a sufficient amount of current for resetting.

While the reset signal RESET is activated to the low level, the set signal SET also remains activated. Thereby, the current in the set region continuously passes to the nonvolatile memory element PC to be set, and thus, the phase change material that configures the nonvolatile memory element PC is heated to temperatures above the crystallization temperature and below the fusing point.

At time t4, the select signal F is returned to the low level, and the set signal SET and the reset signal RESET are returned to the high level. Thereby, the transistors 32 and 34 included in the word-line drive circuit 30 are turned on, and the word line WL is returned to the source electric potential VSS. Alternatively, both the transistors 43 and 44 included in the bit-line drive circuit 40 are turned off, and a current supply is ended.

Figure 7:
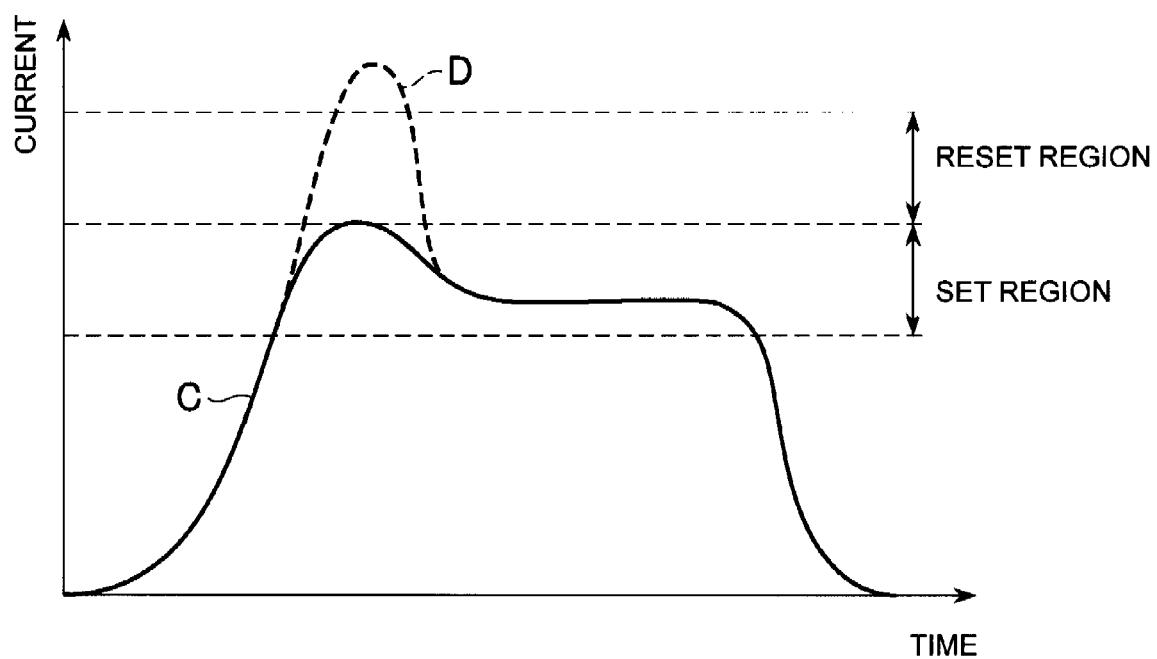
FIG. 7 is a graph showing a current waveform at the time of changing the nonvolatile memory element from the reset state to the set state.

FIG. 7 is a graph showing a current waveform at the time of changing the nonvolatile memory element PC from the reset state to the set state.

Figure 10:
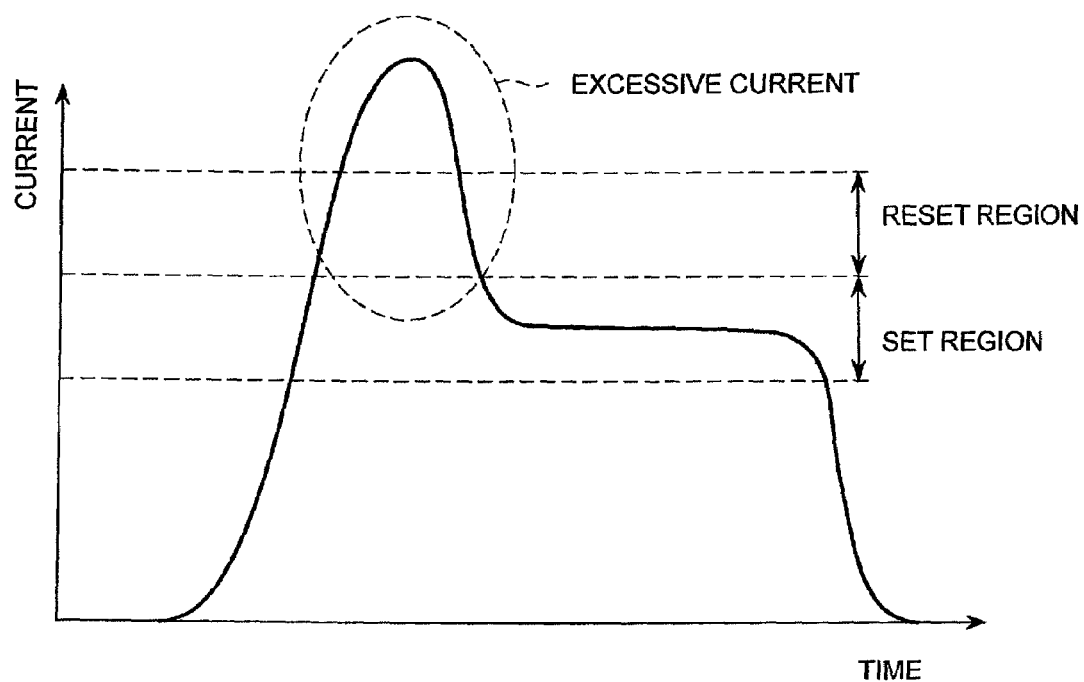
FIG. 10 is a graph showing a current waveform at the time of changing a nonvolatile memory element from the reset state to the set state.

The nonvolatile memory element PC in the reset state, that is, the nonvolatile memory element PC of which phase change material is in the amorphous state, has a negative resistance characteristic. Thus, as shown in a waveform C in FIG. 7, a small amount of excessive current is passed due to the snap-back also in this embodiment. However, at this time, the gate voltage of the selective transistor Tr is set to the VDD, and the current drive capability is limited. As a result, a peak of the excessive current is greatly suppressed. That is, it is possible to supply a stable amount of current without greatly deviating from the current in the set region. Accordingly, damage inflicted on the nonvolatile memory element PC is very small as compared to the conventional case. It is noted that a waveform D shown for comparison is a waveform of a current that passes in the conventional nonvolatile memory, and is equal to that shown in FIG. 10.

Figure 8:
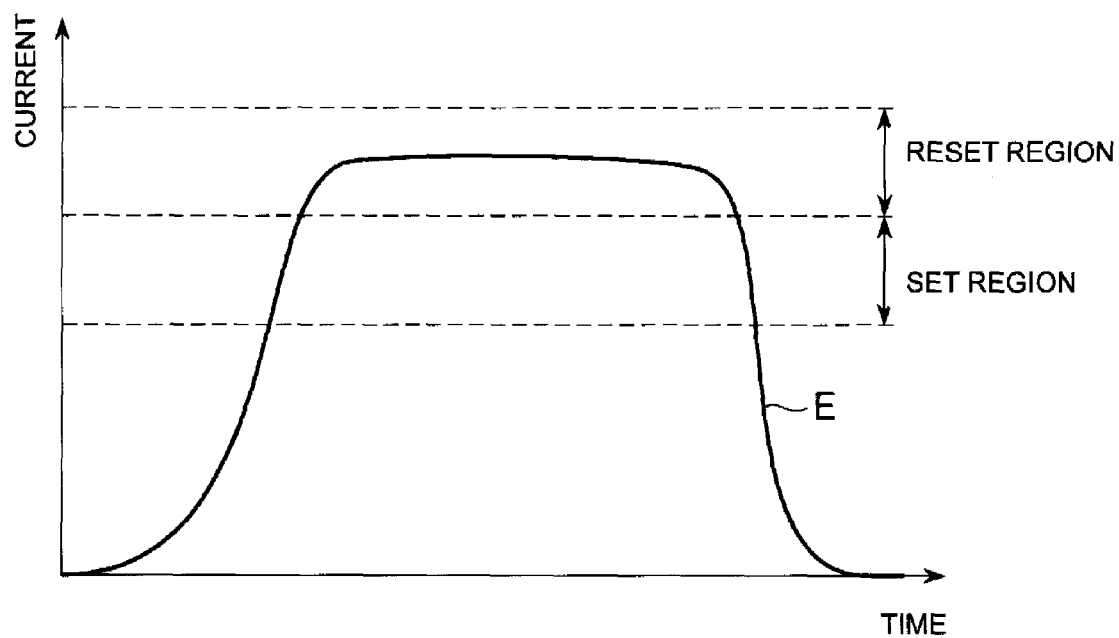
FIG. 8 is a graph showing a current waveform at the time of changing the nonvolatile memory element from the set state to the reset state.
Figure 9:
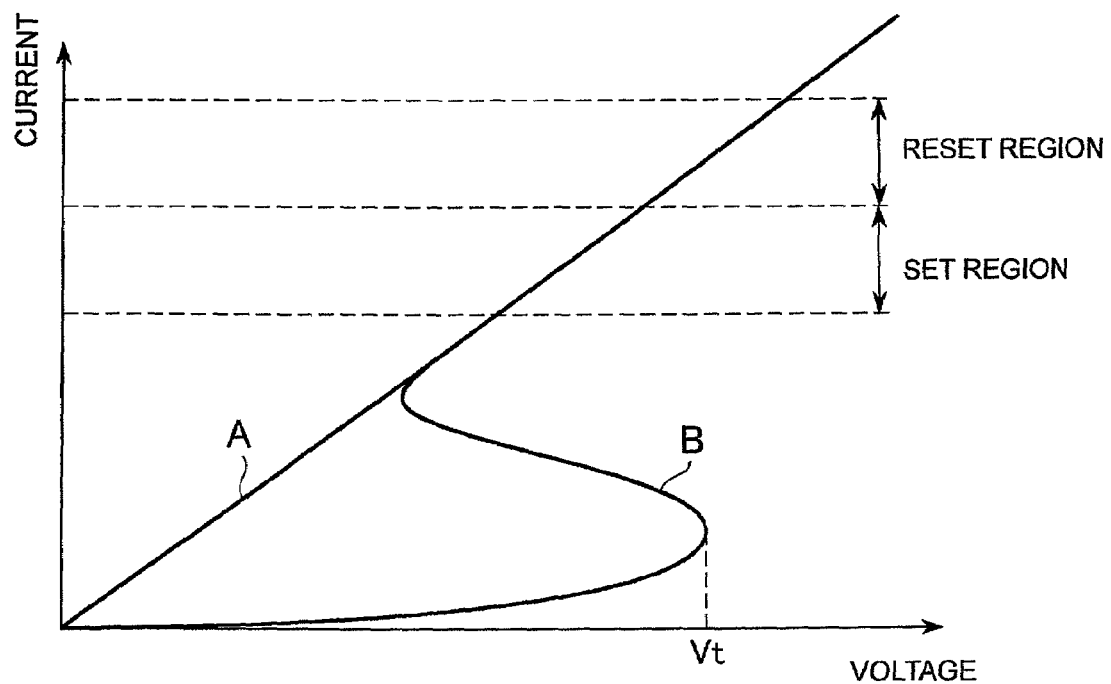
FIG. 9 is a graph showing a current-voltage characteristic of a nonvolatile memory element in which a phase change material is used.

FIG. 8 is a graph showing a current waveform at the time of changing the nonvolatile memory element PC from the set state to the reset state.

The nonvolatile memory element PC in the set state does not have the negative resistance characteristic, and shows a property as a normal resistive device. Thus, as shown in a waveform E in FIG. 8, it is possible to supply a nearly constant current.

As described above, the current in the reset region is a current necessary for heating the phase change material that configures the nonvolatile memory element PC to a temperature above the fusing point, and is a relatively large amount of current. However, the gate voltage of the selective transistor Tr is increased to the VPP at timing at which the reset signal RESET is activated, and thus, it is possible to supply the nonvolatile memory element PC with a sufficient amount of current for resetting.

When a desired nonvolatile memory element PC is thus set or reset, and thereafter, the read circuit 50 is used to detect whether a predetermined amount of current passes in the bit line BL, it becomes possible to read the written data.

As described above, according to the present embodiment, in a period of the time t2 to t3, which is a former portion of the write operation, the level of the word line WL is set to the VDD and the set signal SET is activated, and in the period of the time t3 to t4, which is a latter portion of the write operation, the level of the word line WL is set to the VPP and the reset signal RESET is activated. Thus, it becomes possible to effectively suppress the excessive current caused due to the snap-back and correctly set and reset the nonvolatile memory element PC.

Further, according to the present embodiment, the same sequence is used in the both cases of setting and resetting the nonvolatile memory element PC. Thus, it is possible to simultaneously write different data into a plurality of memory cells MC connected to the same word line WL. Accordingly, it is possible to achieve simplification of control and a high-speed write operation.

The present invention can preferably apply to the semiconductor memory device, especially a PRAM.

Figure 11:
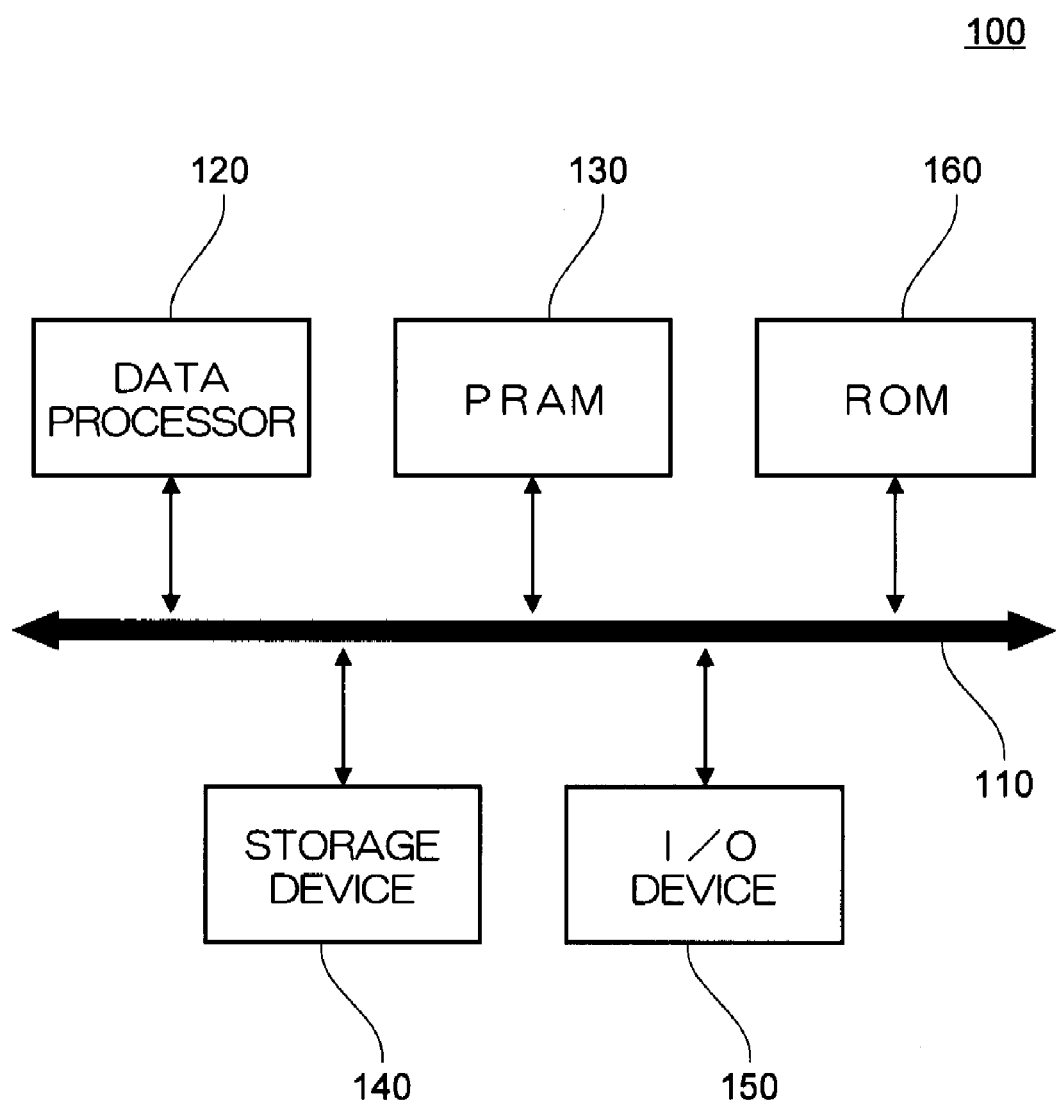
FIG. 11 is a block diagram showing a data processing system using the PRAM.

FIG. 11 is a block diagram showing a data processing system using the PRAM that the present invention is applied.

The data processing system 100 shown in FIG. 11 includes a data processor 120 and a PRAM 130 that the present invention is applied are connected to each other via a system bus 110. The data processor 120 can be selected from at least a microprocessor (MPU) and a digital signal processor (DSP). In FIG. 11, although the data processor 120 and the PRAM 130 are connected via the system bus 110 in order to simplify the diagram, they can be connected via not the system bus 110 but a local bus.

Further, in FIG. 11, although only one set of system bus 110 is employed in the data processing system 100 in order to simplify the diagram, a serial bus or a parallel bus connected to the system bus 110 via connectors can be provided. As shown in FIG. 11, a storage device 140, an I/O device 150, and a ROM 160 are connected to the system bus 110. However, they are not essential element for the data processing system 100.

The storage device 140 can be selected from at least a hard disk drive, an optical disk drive, and flash memory device. The I/O device 150 can be selected from a display device such as a liquid crystal display (LCD) and an input device such as a key board or a mouse. The I/O device 150 can consists of either input or output device. Further, although each one element is provided as shown in FIG. 11, two or more same elements can be provided in the data processing system.

While preferred embodiments have been explained above, the present invention is not limited thereto. Various modifications can be made without departing from the scope of the present invention, and such modifications are also intended to be embraced therein.

For example, in the present embodiment, the level of the word line WL is changed in two stages, that is, a change from the VSS to the VDD, and thereafter, a change from the VDD to the VPP. The control of the word line level is not limited to the two stages in the present invention. Accordingly, the level of the word line can be controlled by three stages or more, and the level of the word line can be changed continuously.

In the present embodiment, the level of the word line WL in the period of the time t2 to t3, which is the former portion of the write operation, and that of the bit line BL corresponding to the nonvolatile memory element PC to be set are both set to the VDD. However, it is not required that these levels be equal. Likewise, in the present embodiment, the level of the word line WL in the period of the time t3 to t4, which is the latter portion of the write operation, and that of the bit line BL corresponding to the nonvolatile memory element PC to be reset are both set to the VPP. However, it is not required that these levels be equal.

Further, in the present embodiment, the timing at which the level of the word line WL is changed from the VDD to the VPP and that at which the reset signal RESET is activated are equal (time t3). However, it is not required that these timings be perfectly equal.

While in the present embodiment, the nonvolatile memory element PC is configured of the phase change material, the present invention is not limited thereto. As long as a memory device employing a nonvolatile memory element having a negative resistance characteristic is used, the present invention can be also applicable to other types of nonvolatile memory.

As described above, according to the present invention, an excessive current caused by snap-back can be suppressed. Therefore, damage inflicted on the nonvolatile memory element can be reduced, thereby preventing decrease of the number of rewritings (rewritable life) of a nonvolatile memory.

What is claimed is:

1. A nonvolatile memory device comprising:
   a nonvolatile memory element having a negative resistance characteristic, wherein the nonvolatile memory element is changeable at least to a first state and a second state, each of which differs in electrical resistance;
   a selective transistor connected in series to the nonvolatile memory element;
   a bit line that supplies the nonvolatile memory element with a current;
   a controller that changes a current drive capability of the selective transistor gradually or continuously during a write operation to the nonvolatile memory element; and
   a word-line drive circuit that is controlled by the controller, wherein
   the word-line drive circuit applies a first selective voltage to the control electrode of the selective transistor in a first period, and applies a second selective voltage higher than the first selective voltage to the control electrode of the selective transistor in a second period that follows the first period.

2. The nonvolatile memory device as claimed in claim 1, wherein the nonvolatile memory element includes a phase change material.

3. The nonvolatile memory device as claimed in claim 1, wherein the first selective voltage is lower than at least the second write voltage.

4. The nonvolatile memory device as claimed in claim 1, further comprising a bit-line drive circuit that is controlled by the controller,
the bit-line drive circuit including a first drive circuit that applies a first write voltage to the bit line and a second drive circuit that applies a second write voltage higher than the first write voltage to the bit line,
the controller activates the first drive circuit at least in the first period when the nonvolatile memory element is changed to the first state,
the controller inactivates the first drive circuit in the first period and activates the second drive circuit in the second period when the nonvolatile memory element is changed to the second state.

5. The nonvolatile memory device as claimed in claim 4, wherein the controller activates the first drive circuit in the first period and the second period when the nonvolatile memory element is changed to the first state.

6. The nonvolatile memory device as claimed in claim 4, wherein the first selective voltage is lower than at least the second write voltage.

7. The nonvolatile memory device as claimed in claim 6, wherein the first selective voltage and the first write voltage are substantially equal, and the second selective voltage and the second write voltage are substantially equal.

8. A nonvolatile memory device, comprising: a plurality of bit lines;
a plurality of nonvolatile memory element having a negative resistance characteristic and a plurality of selective transistors, each of which is connected in series to the plurality of bit lines;
a word line commonly connected to control electrodes of the plurality of selective transistors;
a plurality of bit-line drive circuits that drive each 25 of the plurality of bit lines; and
a word-line drive circuit that drives the word line, wherein the word-line drive circuit applies a first selective voltage to the word line in a first period, and applies a second selective voltage higher than the first selective voltage to the word line in a second period that follows the first period,
among the plurality of bit-line drive circuits, bit-line drive circuits corresponding to the nonvolatile memory devices to be changed to a relatively low-resistant first state apply a first write voltage to a corresponding bit lines at least in the first period, and
among the plurality of bit-line drive circuits, bit-line drive circuits corresponding to the nonvolatile memory devices to be changed to a relatively high-resistant second state apply a second write voltage higher than the first write voltage to a corresponding bit lines in the second period.

9. The nonvolatile memory device as claimed in claim 8, wherein the bit-line drive circuits corresponding to the nonvolatile memory devices to be changed to the first state apply the first write voltage to a corresponding bit lines in the first period and the second period.

10. The nonvolatile memory device as claimed in claim 9, wherein the bit-line drive circuits corresponding to the nonvolatile memory devices to be changed to the second state apply neither the first write voltage nor the second write voltage to a corresponding bit lines in the first period.

11. The nonvolatile memory device as claimed in claim 8, wherein the bit-line drive circuits corresponding to the nonvolatile memory devices to be changed to the second state apply neither the first write voltage nor the second write voltage to a corresponding bit lines in the first period.

12. The nonvolatile memory device as claimed in claim 8, wherein the first selective voltage and the first write voltage are substantially equal, and the second selective voltage and the second write voltage are substantially equal.

13. A control method of a nonvolatile memory device including a nonvolatile memory element having a negative resistance characteristic, a selective transistor connected in series to the nonvolatile memory element, and a bit line that supplies the nonvolatile memory element with a current, the control method comprising:
applying a first selective voltage to a control electrode of the selective transistor in a first period; and applying a second selective voltage higher than the first selective voltage to the control electrode of the selective transistor in a second period that follows the first period.

14. The control method of a nonvolatile memory device as claimed in claim 13, wherein
a first write voltage is applied to the bit line at least in the first period when the nonvolatile memory element to be changed to a first state,
a second write voltage higher than the first write voltage is applied to the bit line in the second period when the nonvolatile memory element to be changed to a second state.

15. The control method of a nonvolatile memory device as claimed in claim 14, wherein
the first write voltage is applied to the bit line in the first period and the second period when the nonvolatile memory element to be changed to the first state.

16. The control method of a nonvolatile memory device as claimed in claim 14, wherein
the second write voltage is not applied to the bit line in the first period when the nonvolatile memory element to be changed to the second state.

17. The control method of a nonvolatile memory device as claimed in claim 14, wherein the first selective voltage and the first write voltage are substantially equal, and the second selective voltage and the second write voltage are substantially equal.

18. The control method of a nonvolatile memory device as claimed in claim 14, wherein the first state is a relatively low-resistant state and the second state is a relatively high-resistant state.

19. A data processing system comprising a data processor and a nonvolatile memory device, the nonvolatile memory device comprising:
a nonvolatile memory element having a negative resistance characteristic;
a selective transistor connected in series to the nonvolatile memory element;
a bit line that supplies the nonvolatile memory element with a current;
a controller that changes a current drive capability of the selective transistor gradually or continuously during a write operation to the nonvolatile memory element; and
a word-line drive circuit that is controlled by the controller, wherein the word-line drive circuit applies a first selective voltage to the control electrode of the selective transistor in a first period, and applies a second selective voltage higher than the first selective voltage to the control electrode of the selective transistor in a second period that follows the first period.

* * * * *

UNITED STATES PATENT AND TRADEMARK OFFICE
CERTIFICATE OF CORRECTION

| | | |
|---|---|---|
| PATENT NO. | : 7,701,758 B2 | |
| APPLICATION NO. | : 11/771537 | |
| DATED | : April 20, 2010 | |
| INVENTOR(S) | : Kiyoshi Nakai | |

It is certified that error appears in the above-identified patent and that said Letters Patent is hereby corrected as shown below:

Column 11, line 37, delete "25".

Signed and Sealed this
Fourth Day of January, 2011

David J. Kappos
*Director of the United States Patent and Trademark Office*